(12) United States Patent
Kim (10) Patent No.: US 8,026,604 B2
(45) Date of Patent: Sep. 27, 2011

(54) SEMICONDUCTOR DEVICES HAVING CONTACT HOLES INCLUDING PROTRUSIONS EXPOSING CONTACT PADS

(75) Inventor: Byung-yoon Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 51 days.

(21) Appl. No.: 11/850,208

(22) Filed: Sep. 5, 2007

(65) Prior Publication Data

US 2008/0067678 A1    Mar. 20, 2008

(30) Foreign Application Priority Data

Sep. 14, 2006  (KR) ........................ 10-2006-0089133

(51) Int. Cl.
    *H01L 23/52*    (2006.01)
(52) U.S. Cl. ........ 257/750; 257/752; 257/415; 438/618; 438/262; 438/622; 438/253
(58) Field of Classification Search ............ 257/E21.537, 257/E21.538, E21.539, 210–211, 503, 508, 257/E33.062, E33.063, E33.064, E33.065, 257/E33.066, E31.124, E31.125, E31.126, 257/E51.019; 438/98, 100, 584–688
See application file for complete search history.

(56) References Cited

U.S. PATENT DOCUMENTS

| | | | |
|---|---|---|---|
| 6,593,190 B2 * | 7/2003 | Lee et al. ..................... | 438/262 |
| 6,649,508 B1 * | 11/2003 | Park et al. ................... | 438/618 |
| 7,492,020 B2 * | 2/2009 | Suzuki ........................ | 257/415 |
| 2002/0192976 A1 * | 12/2002 | Trapp et al. ................. | 438/723 |
| 2003/0162353 A1 * | 8/2003 | Park ............................ | 438/253 |
| 2005/0042829 A1 * | 2/2005 | Kim et al. .................... | 438/268 |
| 2005/0136642 A1 * | 6/2005 | Lee et al. ..................... | 438/622 |

FOREIGN PATENT DOCUMENTS

| | | |
|---|---|---|
| KR | 1020040060335 A | 7/2004 |
| KR | 1020050012956 A | 2/2005 |
| KR | 1020050024590 A | 3/2005 |
| KR | 1020060029007 A | 4/2006 |
| KR | 1020060034930 A | 4/2006 |
| KR | 1020060108432 A | 10/2006 |
| KR | 1020040081268 A | 9/2007 |

* cited by examiner

*Primary Examiner* — Marcos D Pizarro Crespo
*Assistant Examiner* — Sue Tang
(74) *Attorney, Agent, or Firm* — Myers Bigel Sibley & Sajovec

(57) ABSTRACT

Semiconductor devices are provided including a semiconductor substrate and a first interlayer insulating layer on the semiconductor substrate. A contact pad is provided in the first interlayer insulating layer and a second insulating layer is provided on the first interlayer insulating layer. A contact hole is provided in the second interlayer insulating layer. The contact hole exposes the contact pad and a lower portion of the contact hole has a protrusion exposing the contact pad. The protrusion is provided on the second interlayer insulating layer. A contact spacer is provided on inside sidewalls of the contact hole and fills the protrusion. A contact plug is provided in the contact hole. Related methods are also provided herein.

7 Claims, 7 Drawing Sheets

SEMICONDUCTOR DEVICES HAVING CONTACT HOLES INCLUDING PROTRUSIONS EXPOSING CONTACT PADS

CLAIM OF PRIORITY

This application is related to and claims priority from Korean Patent Application No. 10-2006-0089133 filed on Sep. 14, 2006, in the Korean Intellectual Property Office, the disclosure of which is hereby incorporated herein by reference as if set forth in its entirety.

FIELD OF THE INVENTION

The present invention generally relates to semiconductor devices and, more particularly, to semiconductor devices and related methods of fabrication.

BACKGROUND OF THE INVENTION

As semiconductor devices become more highly integrated, the size of a contact hole that connects one element to another element or one layer to another layer may decrease and the thickness of an interlayer insulating layer may increase. Thus, the aspect ratio of the contact hole, i.e., the ratio between the height of the contact hole and the diameter of the contact hole, increases and an alignment margin of the contact hole decreases in a photolithography process. Accordingly, the formation of small contact holes by conventional methods may be difficult.

For this reason, the size of a buried contact (BC) serving as a storage node contact is also decreased, thereby the depth thereof becomes gradually smaller from an upper part to a lower part, and the contact hole is not completely formed. Accordingly, in order to increase the size of the buried contact, the size of the contact hole may be increased by, for example, performing a wet etching process on the contact hole after formation of the contact hole.

Meanwhile, as semiconductor devices become more highly integrated, the size of a bit line may be reduced, and a margin for insulating an underlying pad may become insufficient during the wet etch process performed for the purpose of increasing the size of the buried contact, thereby partially exposing an adjacent pad. Accordingly, an etching solution may penetrate through a direct contact (DC) that electrically connects the bit line to an underlying contact pad, so that a conductive material may be etched.

Therefore, the direct contact (DC) of the underlying bit line may be partially filled with an insulating material or a conductive material of a buried contact (BC) in a subsequent process, thereby resulting in unwanted electrical contact failures.

SUMMARY OF THE INVENTION

Some embodiments of the present invention provide semiconductor device including a semiconductor substrate and a first interlayer insulating layer on the semiconductor substrate. A contact pad is provided in the first interlayer insulating layer and a second insulating layer is provided on the first interlayer insulating layer. A contact hole is provided in the second interlayer insulating layer. The contact hole exposes the contact pad and a lower portion of the contact hole has a protrusion exposing the contact pad. The protrusion is provided on the second interlayer insulating layer. A contact spacer is provided on inside sidewalls of the contact hole and fills the protrusion. A contact plug is provided in the contact hole.

In further embodiments of the present invention, the second interlayer insulating may include a first insulating layer on the first interlayer insulating layer and a second insulating layer on the first insulating layer. The protrusion may be formed on the first insulating layer. A thickness of the first insulating layer may be smaller than a thickness of the second insulating layer. The first and second insulating layers may have different etch rates.

In still further embodiments of the present invention, the first and second insulating layers may be doped with impurities such that an impurity concentration of the first insulating layer is higher than an impurity concentration of the second insulating layer. The first and second insulating layers may include borosilicate glass (BSG), phosphorous silicate glass (PSG), and/or borophosphorous silicate glass (BPSG).

In some embodiments of the present invention, the contact plug may include a metal barrier layer and a metal layer on the metal barrier layer.

In further embodiments of the present invention, the contact spacer may include a nitride layer.

In still further embodiments of the present invention, an outer spacer enclosing exterior sidewalls of an upper portion of the contact pad may be provided.

Although embodiments of the present invention are primarily discussed above with respect to semiconductor devices, methods of fabricating semiconductor devices are also provided herein.

DETAILED DESCRIPTION OF EMBODIMENTS OF THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that although the terms first and second are used herein to describe various elements, these elements should not be limited by these terms. These terms are only used to distinguish one element from another element.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning in other words consistent with their meaning in the context of the relevant art and this specification and will not be interpreted in an idealized or overly formal sense unless expressly so defined herein.

Figure 1:
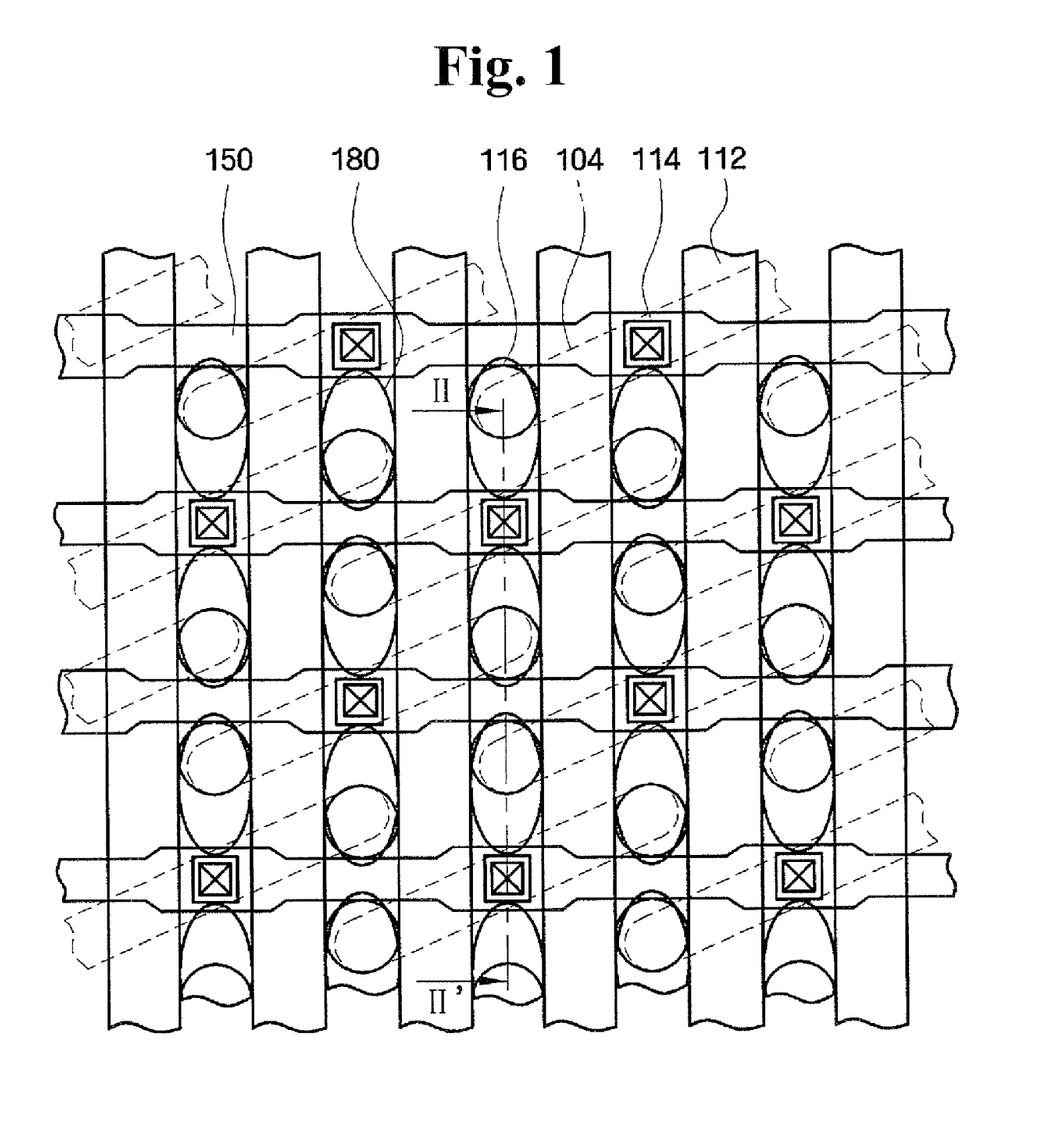
FIG. 1 is a layout view of semiconductor devices according to some embodiments of the present invention.

Some semiconductor devices according to some embodiments of the present invention will now be discussed with respect to FIGS. 1 and 2. FIG. 1 is a layout view of semiconductor devices according to some embodiments of the present invention and FIG. 2 is a cross-section of the semiconductor device of FIG. 1 taken along the line II-II'.

Figure 2:
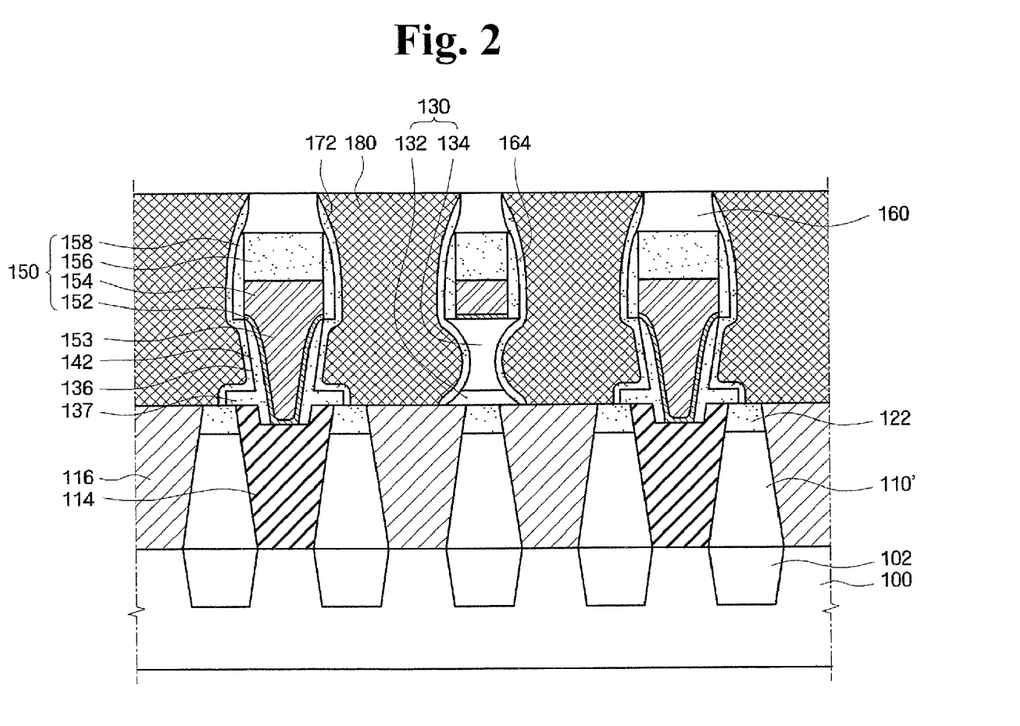
FIG. 2 is a cross-section of the semiconductor device illustrated in FIG. 1 taken along the line II-II'.

As illustrated in FIGS. 1 and 2, a semiconductor substrate 100 includes active regions 104 defined by isolation films 102, and a plurality of gate lines 112 extending in one direction are provided on the semiconductor substrate 100. Impurity regions (not shown) are formed in the active regions 104 at both sides of each of the gate lines 112.

A first interlayer insulating layer 110' is formed on the gate lines 112, and contact pads 114 and 116 are formed in the first interlayer insulating layer 110' between the gate lines 112. The contact pads 114 and 116 are formed of a conductive material, such as polysilicon, or a metallic material. The contact pads 114 and 116 may be self-aligned contact (SAC) pads with respect to the gate lines 112.

The contact pads can be divided into a bit line contact pad 114 electrically connected to an upper bit line 150 and a storage node contact pad 116 electrically connected to an upper storage node (not shown). An outer spacer 122 enclosing exterior sidewalls of upper portions of the contact pads 114 and 116 is formed on the first interlayer insulating layer 110' between the contact pads 114 and 116. The outer spacer 122 may include, for example, silicon nitride (SiN) or silicon oxynitride (SiON).

A second interlayer insulating layer 130 is formed on the contact pads 114 and 116 and the outer spacer 122. The second interlayer insulating layer 130 includes a bit line contact plug 153 electrically connected to the bit line contact pad 114.

In some embodiments of the present invention, the second interlayer insulating layer 130 may have a stack of one or more insulating layers having different etch rates. For example, the second interlayer insulating layer 130 may have a structure in which a first insulating layer 132 and a second insulating layer 134 are sequentially stacked. In some embodiments of the present invention, the underlying first insulating layer 132 may be made of a material having a higher etch rate than that of the overlying second insulating layer 134. For example, the first insulating layer 132 and the second insulating layer 134 may be made of the same material whereas they may have different impurity concentrations, so that the first insulating layer 132 and the second insulating layer 134 have the different wet etching rates. In other words, the impurity concentration of the underlying first insulating layer 132 may be higher than that of the overlying second insulating layer 134. Accordingly, the wet etch rate of the first insulating layer 132 is higher than that of the second insulating layer 134. In addition, the first insulating layer 132 having a higher etch rate than the second insulating layer 134 is positioned below the second insulating layer 134. Furthermore, in some embodiments of the present invention, a thickness of the first insulating layer 132 may be smaller than that of the second insulating layer 134.

A bit line contact hole 136, which exposes the underlying bit line contact pad 114, is formed on the second interlayer insulating layer 130. The bit line contact hole 136 has a protrusion 137 protruding in a direction adjacent to bit lines 150 and substantially parallel to the semiconductor substrate 100. The protrusion 137 is formed in the first insulating layer 132 of the second interlayer insulating layer 130 and exposes a surface of the bit line contact pad 114. As illustrated, the bit line contact hole 136 may be recessed into the bit line contact pad 114 to a predetermined depth.

A bit line contact spacer 142 filling the protrusion 137 is formed on interior sidewalls of the bit line contact hole 136. The bit line contact spacer 142 may be formed using nitride. The bit line contact spacer 142 covers edges of a surface of the bit line contact pad 114 by the protrusion 137 formed at its lower portion.

A bit line contact plug 153 made of a conductive material is formed in the bit line contact hole 136 having the bit line contact spacer 142. When the bit line contact plug 153 is formed of a conductive layer, a metal barrier layer 152 may be positioned under the metal layer.

In these embodiments of the present invention, since the metal barrier layer 152 contacts the underlying bit line contact pad 114, a metal silicide layer (not shown) may be formed at an interface between the metal barrier layer 152 and the bit line contact pad 114.

A plurality of bit lines 150 are formed on the second interlayer insulating layer 130, the plurality of bit lines 150 being connected to the bit line contact plug 153 and extending in a direction perpendicular to the underlying gate lines 112. Each of the plurality of bit lines 150 includes a stack of a conductive layer 154 and a capping layer 156 for forming a bit line, and a spacer 158 is formed on sidewalls of the bit line conductive layer 154 and the bit line capping layer 156. In these embodiments of the present invention, the bit line conductive layer 154 may also be formed of a metal layer, like the bit line contact plug 153.

A third interlayer insulating layer 160 is positioned on the plurality of bit lines 150. A storage node extending into a contact hole 164, which exposes the underlying storage node contact pad 116, is formed through the second and third interlayer insulating layers 130 and 160. The storage node in the contact hole 164 is formed to increase an exposed area of the underlying storage node contact pad 116. In other words, the storage node in the contact hole 164 is formed to extend in a direction toward the bit lines 150 in the second interlayer insulating layer 130 until it exposes sidewalls of the bit line contact spacer 142 of the bit line contact plug 153. In these embodiments of the present invention, the bit line contact pad 114 adjacent to the storage node contact pad 116 is not exposed due to the bit line contact spacer 142 having the protrusion 137 and the outer spacer 122.

A storage node contact spacer 172 is formed on interior sidewalls of the storage node expanded contact hole 164, and the storage node contact plug 180 made of a conductive material is formed in the storage node expanded contact hole 164. Since the storage node contact plug 180 is formed in the storage node expanded contact hole 164, a contact area between the storage node contact plug 180 and the storage node contact pad 114 increases. Furthermore, use of the storage node contact spacer 172 may reduce the likelihood that a bridge phenomenon will occur between each of adjacent storage node contact plugs 180.

Methods of fabricating semiconductor devices according to some embodiments of the present invention will be discussed with respect to FIGS. 1, 3 through 12, together with FIG. 2. FIGS. 3 through 12 are cross-sections illustrating processing steps in the fabrication of semiconductor devices illustrated in FIG. 1 according to some embodiments of the present invention.

Figure 3:
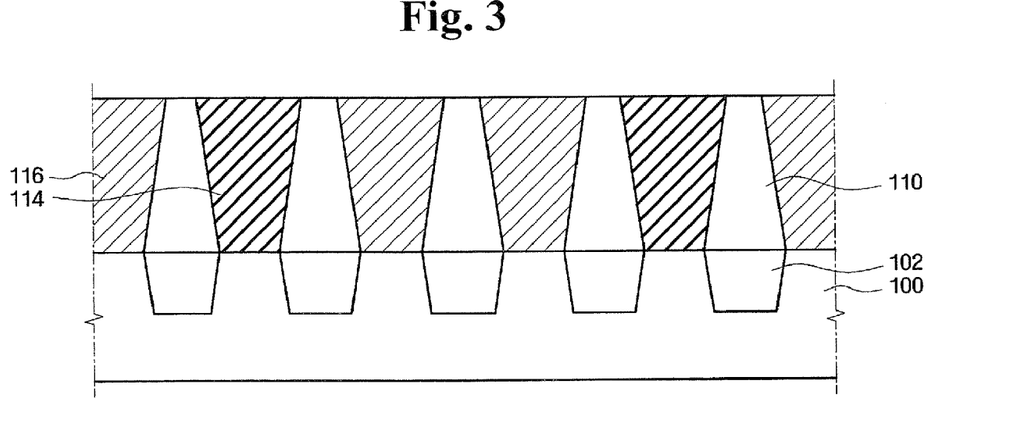
FIGS. 3 through 12 are cross-sections illustrating processing steps in the fabrication of semiconductor devices according to some embodiments of the present invention.

Referring first to FIG. 3, an isolation film 102 is formed on a semiconductor substrate 100 using, for example, a local oxidation of silicon (LOCOS) process or a shallow trench isolation (STI) process to define an active region 104 (FIG. 1) in the semiconductor substrate 100.

A plurality of gate lines 112 (FIG. 1), which extend in one direction across the active region 104 (FIG. 1) defined on the semiconductor substrate 100, are formed on the semiconductor substrate 100. An insulation material is deposited on an entire surface of the semiconductor substrate 100 having the plurality of gate lines 112 and an upper portion of the surface of the semiconductor substrate 100 is planarized using, for example, a chemical-mechanical polishing (CMP) process or an etch-back process, thereby forming a potential first interlayer insulating layer 110. The potential first interlayer insulating layer 110 may include, for example, silicon oxide.

The potential first interlayer insulating layer 110 is etched using, for example, a general photolithography process to form contact holes exposing impurity regions (not shown) in the semiconductor substrate 100. When the contact holes are formed by etching the potential first interlayer insulating layer 110 using an etching gas having a high etching selectivity with respect to the gate lines 112, the contact holes are self-aligned to the gate lines 112 and the impurity regions (not shown) formed in the semiconductor substrate 100 are exposed.

A conductive material, such as polysilicon, highly doped with impurities, or a metallic material, is deposited on an entire surface of the semiconductor substrate 100 having the contact holes to form a conductive layer filling the contact holes. An upper portion of the conductive layer is planarized to expose an upper portion of the potential first interlayer insulating layer 110, thereby forming self-aligned contact (SAC) pads 114 and 116 in the potential first interlayer insulating layer 110. The SAC pads 114 and 116 may be divided into a bit line contact pad 114 and a storage node contact pad 116.

Figure 4:
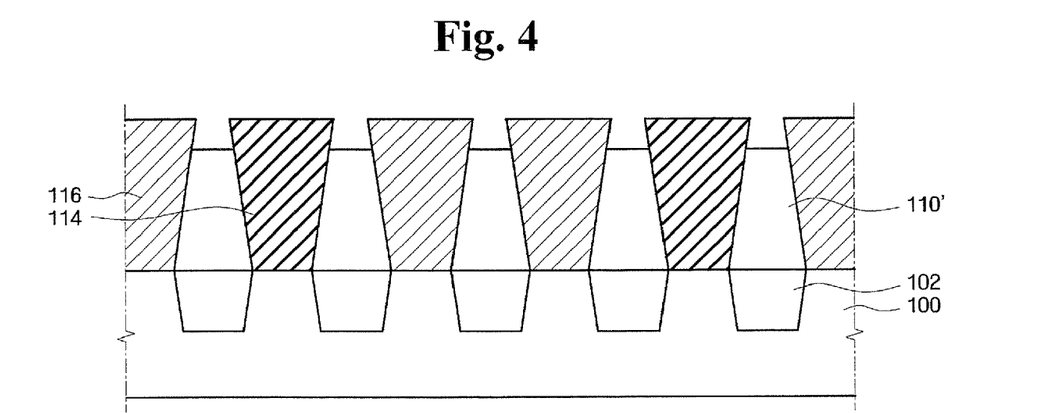

Referring now to FIG. 4, the potential first interlayer insulating layer 110 is recessed by performing, for example, an isotropic etch process on an upper portion of the potential first interlayer insulating layer 110. During the isotropic etch process, the potential first interlayer insulating layer 110 is wet etched such that it is recessed to a depth of from about 500 to about 600 Å from the surface of the contact pads 114 and 116. The potential first interlayer insulating layer 110 may be etched using a mixed solution of, for example, ammonia ($NH_4OH$), hydrogen peroxide ($H_2O_2$), and deionized (DI) water, or a hydrogen fluoride (HF) solution. Accordingly, the contact pads 114 and 116 protrude more than the first interlayer insulating layer 110' in the vicinity of the contact pads 114 and 116, and exterior sidewalls of the upper portions of the contact pads 114 and 116 are partially exposed.

Figure 5:
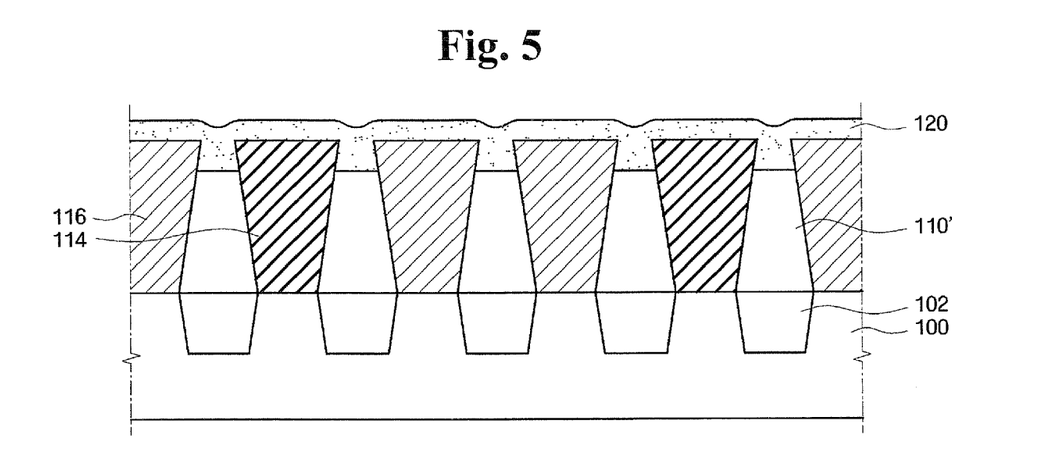

As illustrated in FIG. 5, a nitride layer 120 is deposited on the first interlayer insulating layer 110' and the contact pads 114 and 116 to a predetermined thickness. The nitride layer 120 may include, for example, silicon nitride (SiN) or silicon oxynitride (SiON). The nitride layer 120 may be anisotropically etched until the contact pads 114 and 116 are exposed, thereby forming the outer spacer 122 covering a recessed first interlayer insulating layer 110' between the contact pads 114 and 116 and enclosing the exterior sidewalls of the contact pads 114 and 116 protruding from the top surface of the first interlayer insulating layer 110'. The outer spacer 122 may be formed by planarizing the nitride layer 120 using a CMP process. Accordingly, the outer spacer 122 can protect the exterior sidewalls of the upper portions of the contact pads 114 and 116 in subsequent processes.

Figure 6:
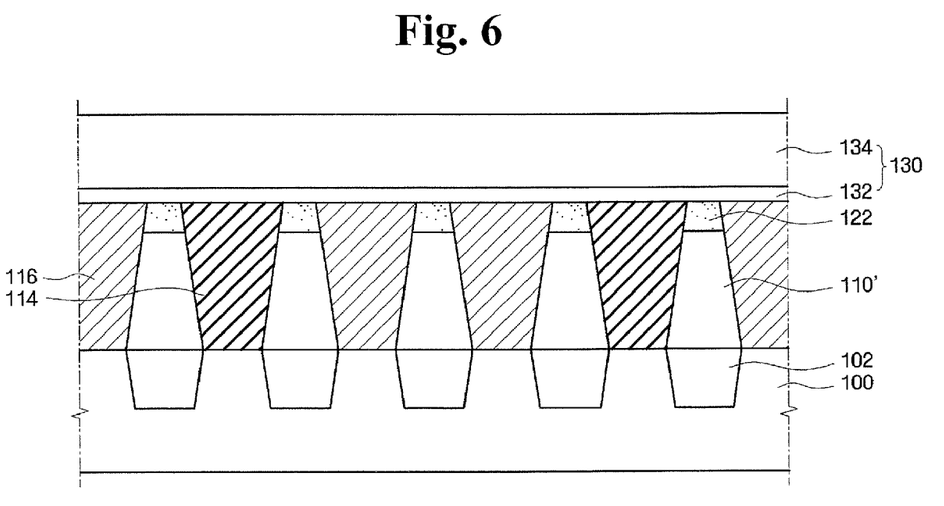

An insulating material is deposited on a surface of the outer spacer 122 and the contact pads 114 and 116 to form the second interlayer insulating layer 130. In particular, the second interlayer insulating layer 130 is formed by depositing one or more insulating layers having different etch rates. In other words, the second interlayer insulating layer 130 may be formed by sequentially stacking the first insulating layer 132 and the second insulating layer 134. In these embodiments of the present invention, the underlying first insulating layer 132 is made of a material having a higher etch rate than that of the overlying second insulating layer 134.

For example, the first insulating layer 132 and the second insulating layer 134 may be formed by, for example, depositing a silicon oxide based material, such as borosilicate glass (BSG), phosphorous silicate glass (PSG), borophosphorous silicate glass (BPSG), plasma enhanced tetraethyl orthosilicate (PE-TEOS), high density plasma (HDP) oxide, or the like.

Furthermore, the second interlayer insulating layer 130 may be formed so as to exhibit different etch rates by varying impurity concentrations of the first insulating layer 132 and the second insulating layer 134. In other words, the first insulating layer 132 and the second insulating layer 134 may be formed of a silicon oxide layer doped with impurities, for example, BSG, PSG, or BPSG. Furthermore, the etch rate of the first insulating layer 132 can be made higher than that of the second insulating layer 134 by making the impurity concentrations of the first insulating layer 132 higher than that of the second insulating layer 134. During the formation of the second interlayer insulating layer 130 in this way, the first insulating layer 132 and the second insulating layer 134 may be formed in-situ.

The underlying first insulating layer 132 formed on the contact pads 114 and 116 and having a relatively high etch rate may be formed to have a thickness smaller than that of the overlying second insulating layer 134.

Figure 7:
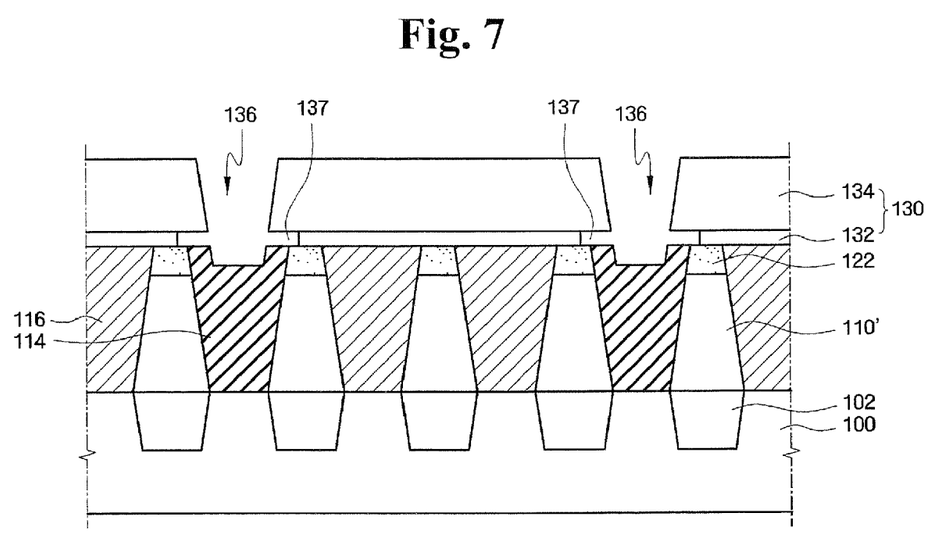

As illustrated in FIG. 7, the second interlayer insulating layer 130 is etched using, for example, a general photolithography process to form the bit line contact hole 136 exposing the bit line contact pad 114. In some embodiments of the present invention, the second interlayer insulating layer 130 consists of the first and second insulating layers 132 and 134 having different etch rates, different sidewall profiles are created at the first and second insulating layers 132 and 134.

In particular, the second interlayer insulating layer 130 is etched by a dry etch process to form a contact hole exposing a surface of the bit line contact pad 114. The bit line contact hole formed by the dry etch process exposes a central portion of the bit line contact pad 114. Thus, the bit line contact hole is subjected to a wet cleaning process. The first insulating layer 132, having a relatively high etch rate, is rapidly etched to form the protrusion 137. The protrusion 137 completely exposes the surface of edges of the bit line contact pad 114, which has not been exposed during the dry etch process. During the wet cleaning process, a mixed solution of a hydrogen fluoride (HF) solution or ammonia (NH$_4$OH), hydrogen peroxide (H$_2$O$_2$), and deionized (DI) water may be used as a wet cleaning solution.

The bit line contact hole 136 having the protrusion 137 can be formed simply by anisotropically etching the second interlayer insulating layer 130. Furthermore, the bit line contact hole 136 may be recessed into the bit line contact pad 114 by partially etching the bit line contact pad 114 during the dry etching process.

Figure 8:
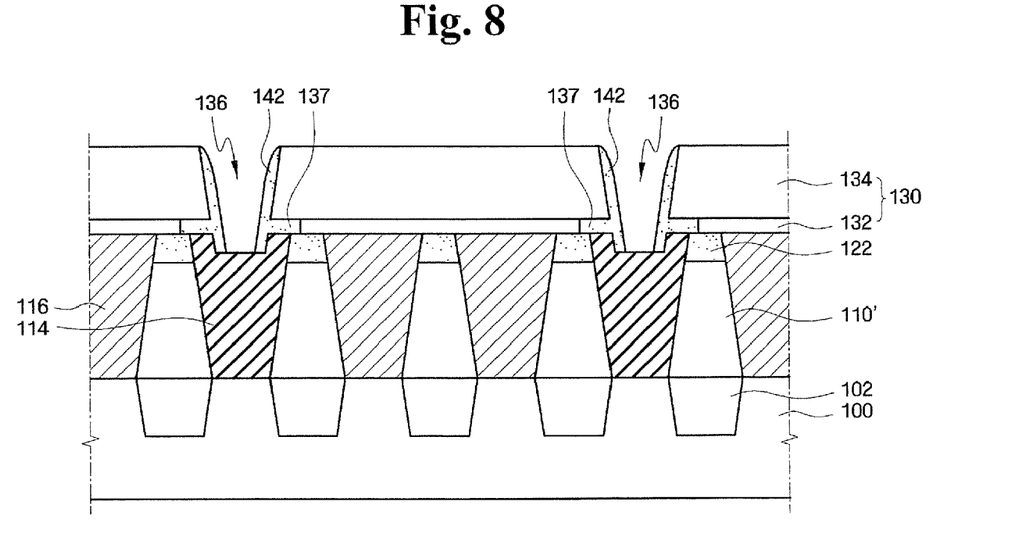

As illustrated in FIG. 8, a spacer nitride layer is deposited on an entire surface of the resultant structure having the bit line contact hole 136. The spacer nitride layer is formed by, for example, depositing silicon nitride (SiN) to a thickness of from about 100 to about 300 Å, filling the protrusion 137 of the bit line contact hole 136. Thereafter, an etch-back process is performed on the spacer nitride layer, thereby forming the bit line contact spacer 142 on the interior sidewalls of the bit line contact hole 136.

Figure 9:
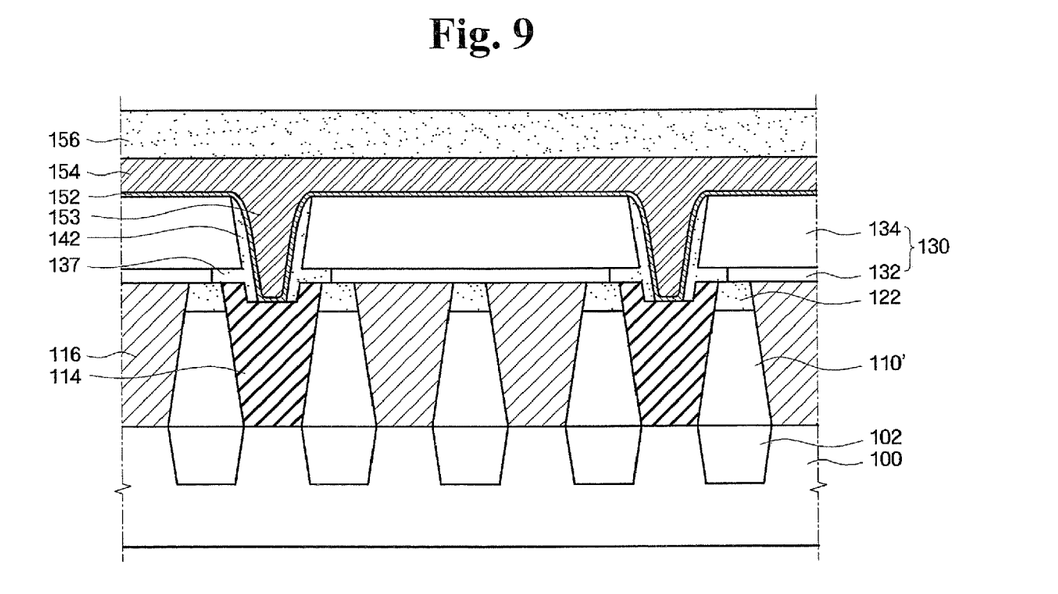

As illustrated in FIG. 9, a conductive material is deposited on the bit line contact hole 136 to fill the same, thereby forming the bit line contact plug 153. In some embodiments of the present invention, the conductive material is deposited thick enough to planarize the upper portion of the second interlayer insulating layer 130, thereby forming the bit line conductive layer 154 together with the bit line contact plug 153.

In particular, the bit line contact plug 153 may be formed of a metal layer made of, for example, tungsten (W), copper (Cu), aluminum (Al), or the like. Before forming the metal layer, the metal barrier layer 152 may be formed very thin in order to reduce the likelihood that diffusion of a metallic material may occur or reduce contact resistance. The metal barrier layer 152a may be formed of at least one selected from Ta, TaN, TaSiN, Ti, TiN, TiSiN, W, WN, or a combination of these materials. When the bit line contact plug 153 is formed in such a manner, the metal silicide layer (not shown) may be formed at the interface between the metal barrier layer 152 and the bit line contact pad 114.

After forming the bit line conductive layer 154, a nitride layer is deposited on the bit line conductive layer 154 to form the bit line capping layer 156.

Figure 10:
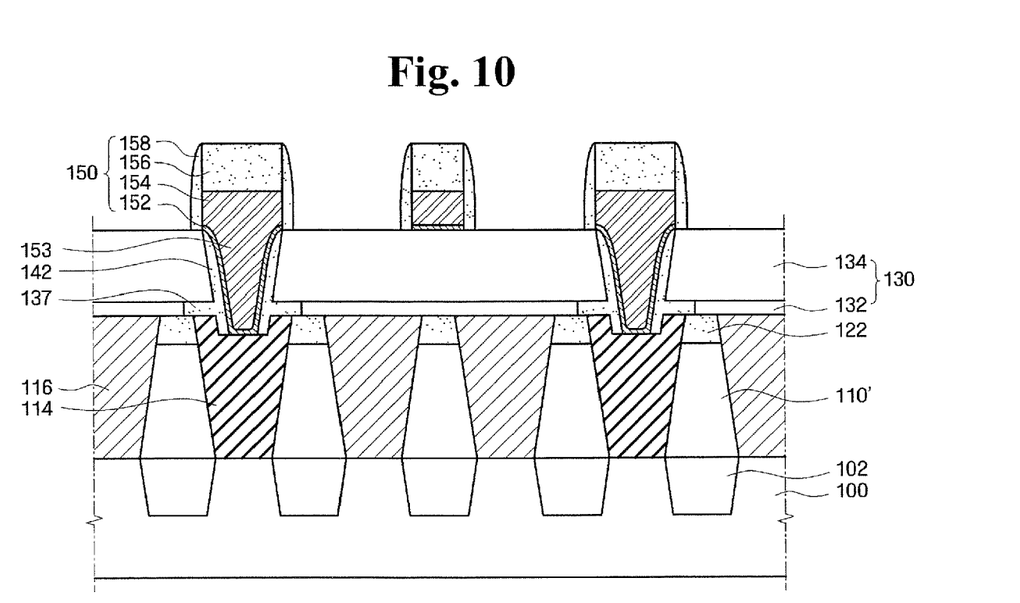

As illustrated in FIG. 10, the bit line conductive layer 154 and the bit line capping layer 156 are patterned to form the plurality of bit lines 150 extending in a direction substantially perpendicular to the underlying gate lines 112. Each of the bit lines 150 includes the bit line spacer 158 formed on the sidewalls of the patterned bit line conductive layer 154 and capping layer 156. The bit line spacer 158 is formed by depositing a nitride layer on an entire surface of the resultant structure formed after patterning the bit line conductive layer 154 and the bit line capping layer 156, and performing an etch-back process thereon.

Figure 11:
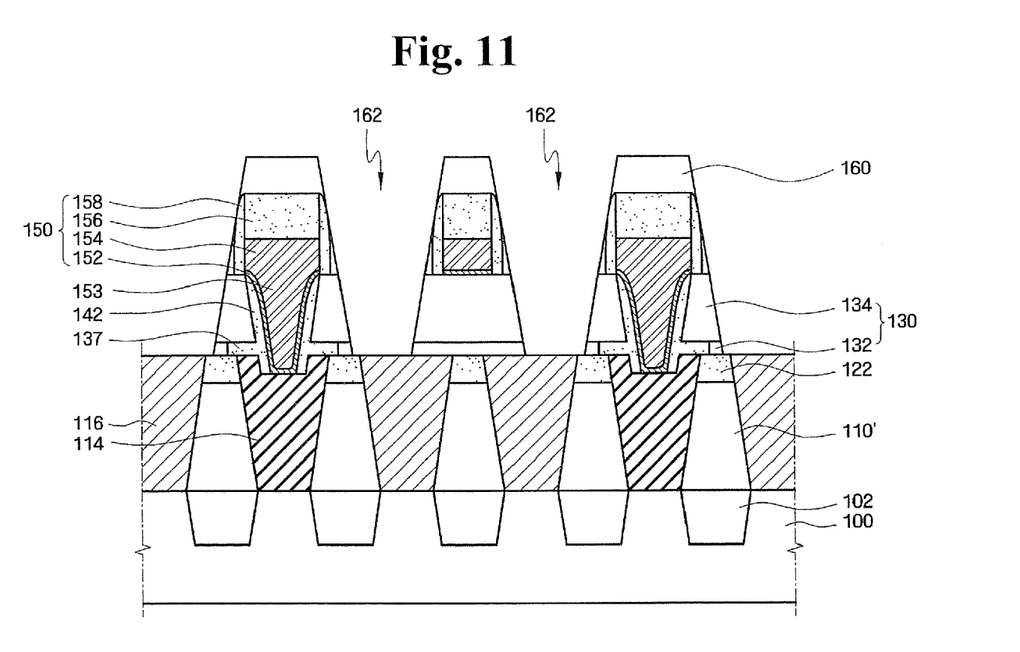

As illustrated in FIG. 11, an insulating material filling the bit lines 150 is deposited on an entire surface of the second interlayer insulating layer 130 having the bit lines 150 and planarized to form the third interlayer insulating layer 160. The third interlayer insulating layer 160 may be formed of a silicon oxide based material, such as borosilicate glass (BSG), phosphorous silicate glass (PSG), borophosphorous silicate glass (BPSG), plasma enhanced tetraethyl orthosilicate (PE-TEOS), high density plasma (HDP) oxide, or the like.

A mask pattern (not shown) is formed on the third interlayer insulating layer 160 to expose the storage node contact pad 116. The second and third interlayer insulating layers 130 and 160 are etched by a dry etch process using the mask pattern, thereby forming a narrow storage node contact opening 162 partially exposing the storage node contact pad 116. Since the storage node contact opening 162 has a large aspect ratio, a width of the storage node contact opening 162 is gradually reduced toward its lower portion.

Figure 12:
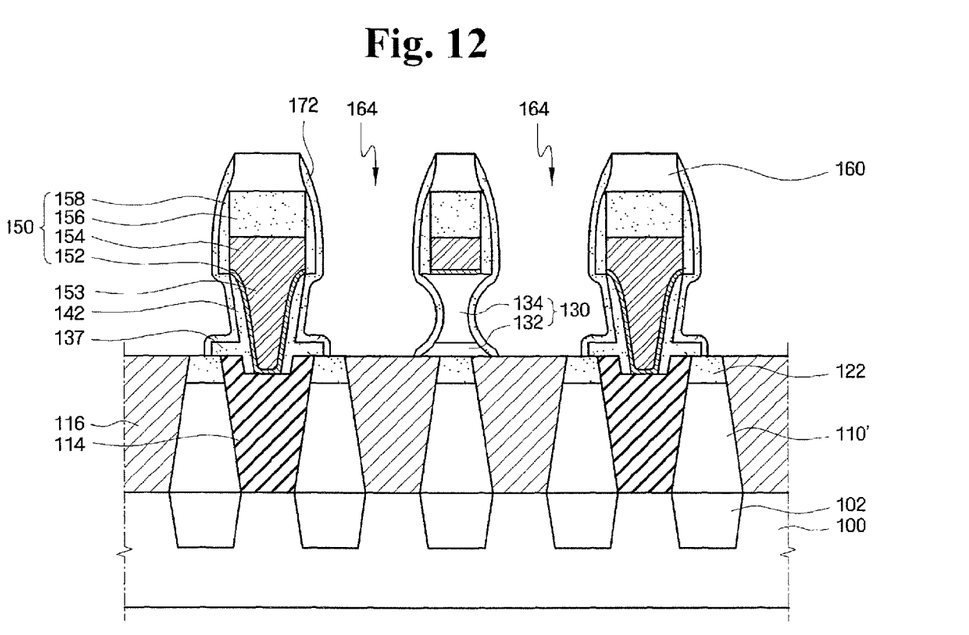

To increase the exposed area of the storage node contact opening 162, the storage node contact opening 162 is etched by a wet etch process. During the wet etch process, a mixed solution of ammonia (NH$_4$OH), hydrogen peroxide (H$_2$O$_2$), and deionized (DI) water, or a hydrogen fluoride (HF) solution may be used as an etchant.

As a result, the storage node contact opening 162 expands in the direction of the bit lines 150, thereby forming the storage node expanded contact opening 164. The bit line contact spacer 142 can reduce the likelihood that the bit line contact plug 153 positioned in the second interlayer insulating layer 130 is damaged by an etchant. In addition, since the upper portion of the contact pad 114 other than a portion contacting the bit line contact plug 153, is surrounded by the outer spacer 122 and the bit line contact spacer 142 having the protrusion 137, it may be possible to reduce the likelihood that the etchant will penetrate into the bit line contact pad 114.

In other words, outer spacer 122 and the bit line contact spacer 142 having the protrusion 137 may protect the bit line contact plug 153 and the bit line contact pad 114 during the wet etch process for forming a storage node expanded contact hole (180 of FIG. 2).

After forming the storage node expanded contact opening 164 in the above-described manner, a storage node contact spacer 172 is formed on interior sidewalls of the storage node expanded contact hole 164. In particular, a contact spacer insulating layer is conformally deposited on a surface of the resultant product having the storage node expanded contact hole 164. The contact spacer insulating layer may be formed by depositing silicon nitride (SiN) to a thickness of from about 100 to about 300 Å. Thereafter, an etch-back process is performed on the conformally deposited contact spacer insulating layer to form the storage node contact spacer 172 on interior sidewalls of the storage node expanded contact hole 164.

Referring again to FIG. 2, the storage node expanded contact hole 164 is filled with a conductive material or a metallic material and planarized, thereby completing the storage node contact plug 180. In other words, the resultant storage node contact plug 180 has an increased contact area with the underlying storage node contact pad 116 while avoiding damages of the bit line contact plug 153.

As discussed above, according to some embodiments of the present invention, since a bit line contact spacer having a protrusion is formed on interior sidewalls of a bit line contact hole, the protrusion may protect a surface of a bit line contact pad other than a portion contacting a bit line contact plug in subsequent processes.

Accordingly, it may be possible to reduce the likelihood or even to prevent an etching solution from penetrating into the surface of the bit line contact pad during a wet etch process for forming a storage node expanded contact hole, thereby reducing the likelihood of electric contact failures of a semiconductor device, which may occur when the bit line contact pad is etched.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A semiconductor device comprising:
   a semiconductor substrate;
   a first interlayer insulating layer on the semiconductor substrate;
   a contact pad in the first interlayer insulating layer;
   a second interlayer insulating layer on the first interlayer insulating layer;
   a contact hole in the second interlayer insulating layer, the contact hole exposing the contact pad and a lower portion of the contact hole having a protrusion exposing a whole surface of the contact pad, the protrusion being on the second interlayer insulating layer;
   a contact spacer on inside sidewalls of the contact hole and filling the protrusion; and
   a contact plug in the contact hole, wherein the second interlayer insulating layer comprises a first insulating layer on the first interlayer insulating layer and a second insulating layer on the first insulating layer and wherein the second insulating layer has a contoured shape such that a width of the second insulating layer is not uniform,
   wherein the first and second insulating layers have different etch rates; and
   wherein the first and second insulating layers are doped with impurities such that an impurity concentration of the first insulating layer is higher than an impurity concentration of the second insulating layer.

2. The semiconductor device of claim 1, wherein the protrusion is formed on the first insulating layer.

3. The semiconductor device of claim 2, wherein a thickness of the first insulating layer is smaller than a thickness of the second insulating layer.

4. The semiconductor device of claim 1, wherein the first and second insulating layers comprise at least one material selected from the group consisting of borosilicate glass (BSG), phosphorous silicate glass (PSG), and borophosphorous silicate glass (BPSG).

5. The semiconductor device of claim 1, wherein the contact plug comprises:
   a metal barrier layer; and
   a metal layer on the metal barrier layer.

6. The semiconductor device of claim 1, wherein the contact spacer comprises a nitride layer.

7. The semiconductor device of claim 1, further comprising an outer spacer enclosing exterior sidewalls of an upper portion of the contact pad.

* * * * *